United States Patent [19]
Higgins et al.

[11] Patent Number: 5,923,178
[45] Date of Patent: Jul. 13, 1999

[54] PROBE ASSEMBLY AND METHOD FOR SWITCHABLE MULTI-DUT TESTING OF INTEGRATED CIRCUIT WAFERS

[75] Inventors: H. Dan Higgins, Chandler; Martin A. Martinez, Phoenix; R. Dennis Bates, Gilbert, all of Ariz.

[73] Assignee: Cerprobe Corporation, Gilbert, Ariz.

[21] Appl. No.: 08/837,399

[22] Filed: Apr. 17, 1997

[51] Int. Cl.⁶ .................................................. G01R 31/02
[52] U.S. Cl. ........................... 324/754; 324/757; 324/762
[58] Field of Search ..................................... 324/754, 757, 324/765, 761, 762

[56] References Cited

U.S. PATENT DOCUMENTS

| | | | |
|---|---|---|---|
| 3,702,439 | 11/1972 | McGahey et al. | 324/757 |
| 4,177,425 | 12/1979 | Lenz | 324/754 |
| 4,554,506 | 11/1985 | Faure et al. | 324/158 |
| 4,636,722 | 1/1987 | Ardezzone | 324/158 |
| 4,843,315 | 6/1989 | Bayer et al. | 324/158 |
| 5,416,429 | 5/1995 | McQuade et al. | 324/762 |
| 5,521,518 | 5/1996 | Higgins | 324/754 |
| 5,534,784 | 7/1996 | Lum et al. | 324/757 |
| 5,589,781 | 12/1996 | Higgins et al. | 324/755 |
| 5,742,174 | 4/1998 | Kister et al. | 324/762 |
| 5,773,987 | 6/1998 | Montoya | 324/757 |

*Primary Examiner*—Josie Ballato
*Assistant Examiner*—Russell M. Kobert
*Attorney, Agent, or Firm*—Cahill, Sutton & Thomas P.L.C.

[57] ABSTRACT

A system for testing an integrated circuit on a semiconductor wafer so as to achieve low probe needle contact resistance with low probe needle force and without substantial scrubbing includes a probe and supporting a plurality of probe needles electrically coupled to an electrical test system above and in alignment with a plurality of contact pads of the integrated circuit, respectively. The wafer is mechanically moved to press probe needles to bring a tip of each probe needle into physical contact with a corresponding contact pad, and is further moved to increase a needle force of each tip against the corresponding contact pad and cause flexing of a curved portion of each probe needle. Each probe needle is curved such that the flexing causes the tip of each probe needle to rock without appreciable sliding on the surface of the contact pad. The rocking and the needle force combine to cause lateral displacement of oxide from between the tip and metal of the contact pad, allowing reliable, low resistance electrical contact between the tip and the contact pad.

8 Claims, 12 Drawing Sheets

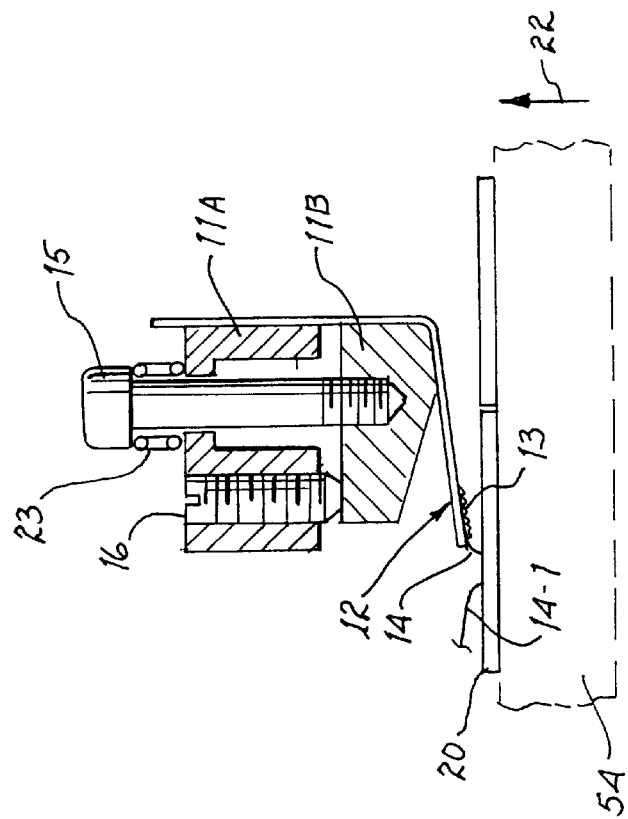
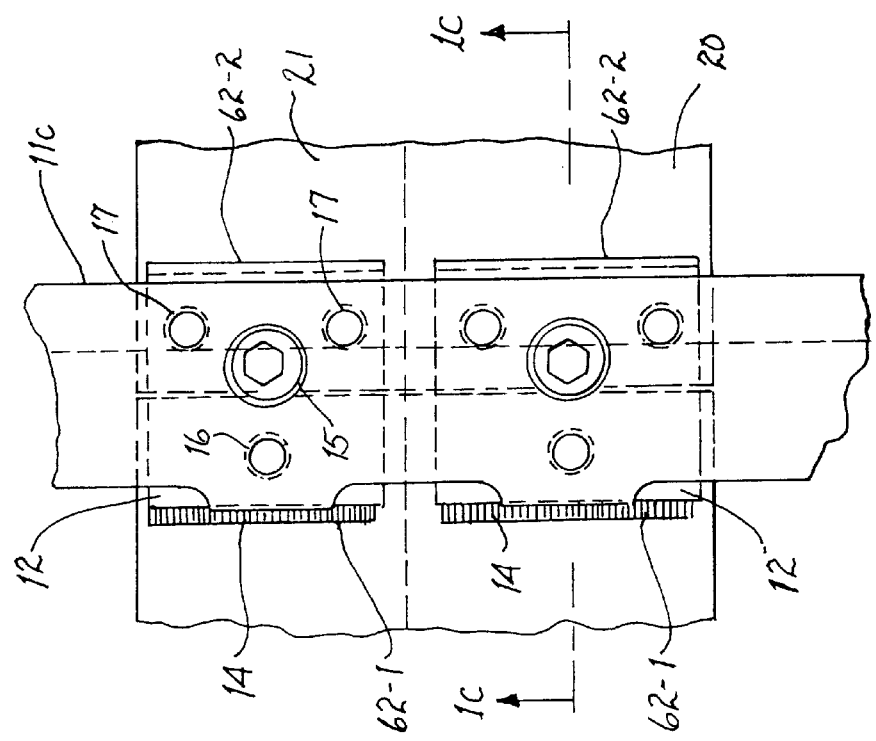

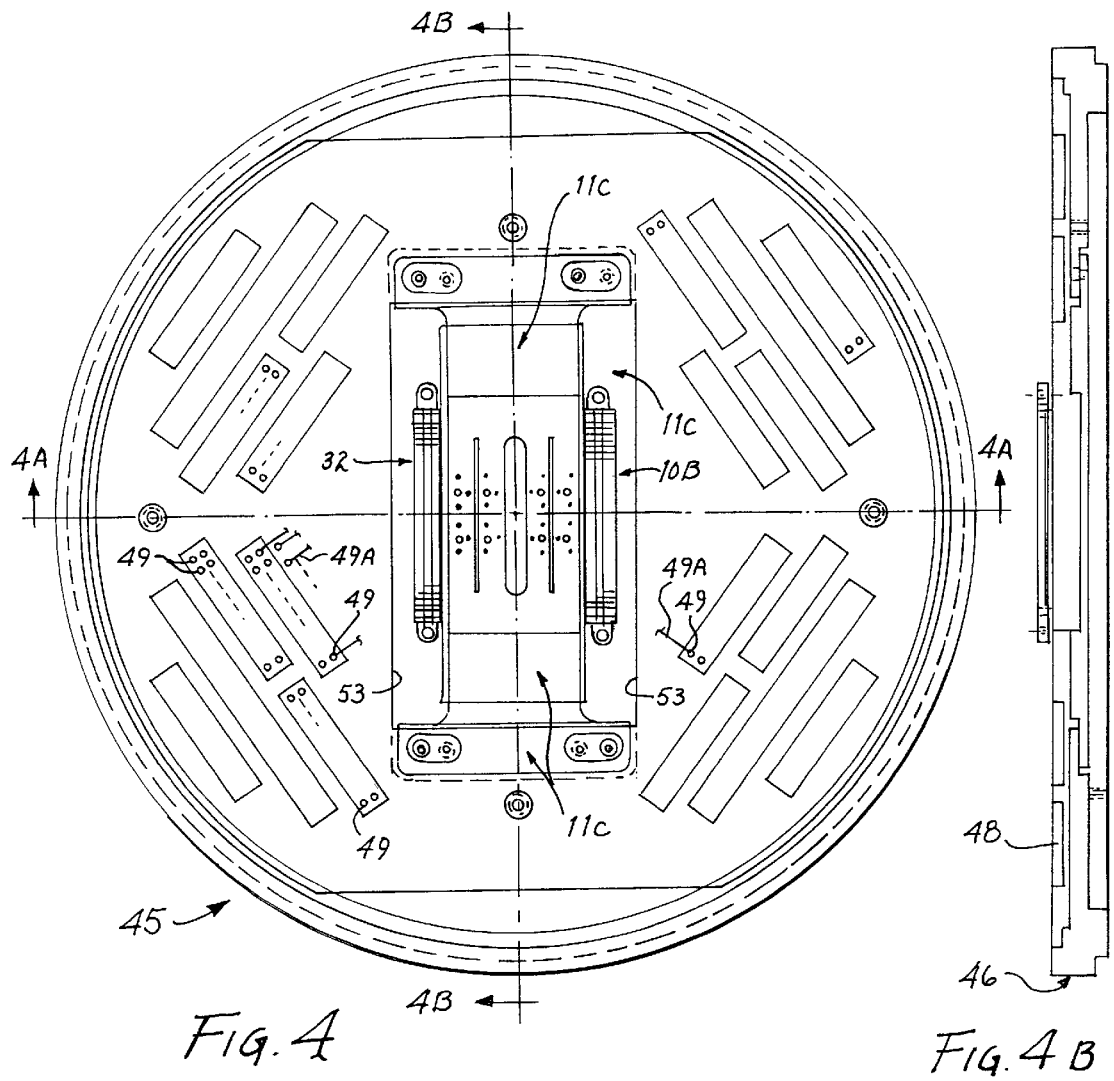
FIG. 4
FIG. 4B
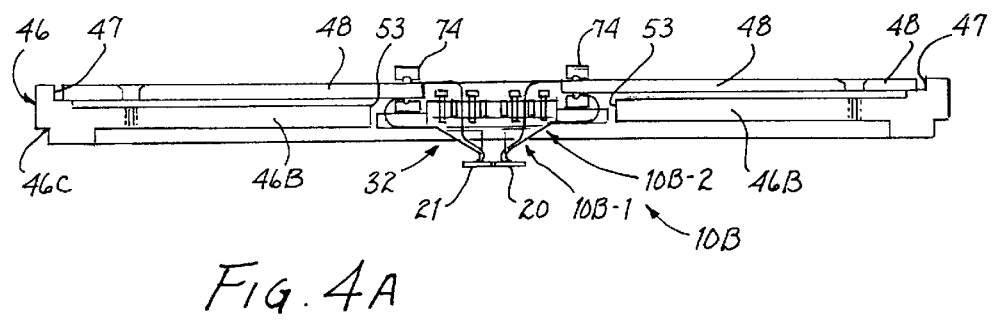
FIG. 4A

PROBE ASSEMBLY AND METHOD FOR SWITCHABLE MULTI-DUT TESTING OF INTEGRATED CIRCUIT WAFERS

BACKGROUND OF THE INVENTION

The invention relates to wafer probe assemblies and methods for reducing "scrubbing" of wafer probe needle tips on bonding pads of an integrated circuit device under test (DUT), and especially to improvements therein which avoid "interference" between probe needles to thereby facilitate simultaneous probing of multiple die on the same semiconductor wafer to thereby reduce the number of "touch downs" of the probe needles required to probe test the entire semiconductor wafer.

U.S. Pat. Nos. 5,521,518 (Higgins), 5,589,781 (Higgins et al.), 5,416,429 (McQuade et al.), 4,554,506 (Faure et al.), 4,843,315 (Bayer et al.), 5,534,784 (Lum et al.) and 4,636,722 (Ardezzone) are generally indicative of the state of the art. It is known that insulative aluminum oxide is usually present on aluminum bonding pads of integrated circuit wafers. It also is known that there may be hundreds of integrated circuit die on a single semiconductor wafer and that it is necessary to "probe test" each die or device under test (DUT) before the wafer is cut into individual integrated circuit die. The die testing often needs to be performed at high speed or high frequency, for example at a 100 MHz data rate, or even much higher.

The above references disclose various known techniques for supporting "probe cards" that support a plurality of probe needles, tips of which must provide reliable electrical contact (i.e., low probe needle contact resistance) with the bonding pads of the DUT during the testing. The shank of a probe needle is typically 5 to 10 mils in diameter. In a typical probe test system, a "test head" supports an "interface assembly", that supports a "probe card" from which all of the probe needles required to probe test a particular semiconductor die extend. Typically, the wafer is supported on a "wafer chuck". After alignment of the probe needles with the corresponding bonding pads of the integrated circuit die has been accomplished, the wafer chuck is raised approximately 3 mils so that the typically inclined probe needles "scrub" through brittle insulative aluminum oxide on the aluminum bonding pads to allow good mechanical and electrical contact of the needle tip with the bonding pad metal and thereby ensure low probe contact resistance. (Alternatively, the wafer chuck can be stationary and the test head can be moved). In any case, the probe needles each need to apply at least approximately 3–15 grams of force against the bonding pad surfaces. That is, reliable probe needle contact to the bonding pad may require the tip of each needle to contact the aluminum bonding pad with a force in the range of 3–15 grams to effectively accomplish the necessary scrubbing. Such scrubbing may involve "scratching" the bonding pad surface through a distance of roughly 0.5 to 1.5 mils while maintaining the 3–15 gram force on the probe needle in order to achieve reliable low resistance electrical contact between the probe needle and the aluminum metal of the bonding pad.

We have found that if the tip of the probe needle does not "scrub" the bonding pad surface to scratch through the aluminum oxide coating, a needle force of roughly 20 grams against the bonding pad is required to achieve low probe contact resistance.

FIG. 6 shows a typical prior art cantilevered probe needle 14 that is inclined relative to the surface of aluminum bonding pad 62. Wafer 20 is supported on wafer chuck 54, which is raised as indicated by arrow 22 through a distance of approximately 3 mils to achieve contact of the needle tip with bonding pad 62. Probe needle 14 is sufficiently elastic or "compliant" to compensate for planarity (non-flatness) of the surface of semiconductor 20 and yet allow probe needle 14 to maintain the 3–15 gram force as it slides along and thereby scrubs aside the insulative aluminum oxide on the surface of aluminum bonding pad 62. The "scrub distance" is indicated by numeral 63, and typically is roughly 0.5 to 1.5 mils for many state-of-the-art wafer probe test systems.

FIG. 7 illustrates several common configurations of bonding pads on various types of semiconductor die 20, identified herein as "type I", "type II", or "type III". The bonding pads 62 usually are in the range of roughly 2–4 mils square, with pitch (center-to-center spacing) in the range of 4 to 10 mils. In a typical memory die, a single column (or row) of bonding pads 62 may be provided as shown, so as to "bisect" the die 20. This bonding pad arrangement is most suitable for "multi-DUT wafer probing", wherein a single "touch down" of probe needles on corresponding bonding pads results in testing of multiple DUTs (die) on the wafer being probe tested. "Type II" bonding pad layouts can include opposed parallel columns of bonding pads located along opposite edges of each chip, in which case multi-DUT wafer probing can be achieved by contacting bonding pads 62-1 on die 20 and the adjacent column of bonding pads 62-2 on die 21. Alternatively, a type II bonding pad arrangement can include two closely spaced columns of bonding pads 62-1 and 62-2 centered on die 20. Type III bonding pad layouts, in which bonding pads 62 are positioned along all four edges of the die, are least well suited to multi-DUT testing.

It would be highly desirable to reduce the number of times the probe needles of a test head need to contact bonding pads of a particular semiconductor wafer in order to probe test the entire wafer. If only one probe card with probe needles to contact all of the bonding pads of a die is provided in a wafer probe test assembly, then the number of "touch downs" required is equal to the number of die on the wafer. However, if the number of "sets" of probe needles (one set being required to probe test one die) is increased in the probe test assembly so that multiple die are probe tested during each touch down, then the number of touch downs is reduced accordingly. The small size of typical integrated circuit die compared to the amount of space required to accommodate all of the prior art probe needles and allow "fan out" of conductors connected thereto has made multi-DUT testing very difficult and impractical. The same considerations have made it difficult to achieve balanced contact force (BCF) on all of the probe needles. Those skilled in the art know that balanced contact force (i.e., providing the same amount of force to urge every probe needle contact tip against a corresponding bonding pad on the DUT) is necessary to prevent premature failure or shortened life of individual probe needles with excess force thereon.

One known technique of making a probe card is to provide a layer of copper or gold plated copper on one surface of a thin layer of polyimide insulator and to provide a pattern of nickel alloy strips on the other face of the polyimide layer. The nickel alloy strips extend beyond one edge of the polyimide layer and form the probe needles, as shown in the above mentioned Higgins and Higgins et al. patents. The portions of the nickel alloy strips on the surface of the polyimide layer coact with the copper plating to function as 50 ohm transmission lines. This permits very high frequency test signals to be reliably transmitted between the probe test system and the bonding pads of the DUT.

Prior art FIG. 8 hereof illustrates a known probe system referred to as the "Cobra" system, in which the upper ends of probe needles 14 are guided through a rigid layer 67 of insulating material, whereat the upper ends of the individual probe needles 14 are electrically connected to suitable conductors of an interface assembly that is connected to an electrical test system. Each of the needles 14 in FIG. 8 is curved as illustrated and the lower end passes through a corresponding clearance hole 70 in a lower rigid layer or template 68 of insulating material. The bottom ends of the needles 14 contact the bonding pads 62 of the wafer 20 being tested. Any "scrubbing" of the lower tips of probe needles 14 on the bonding pads 62 occurs as a result of looseness of the end 14A in the clearance holes 70.

Note that the term "scrubbing" as used herein refers to substantial sliding of a probe needle tip on a bonding pad, e.g., about 0.5 mils or more, and excludes "micro-scrubbing" in which there is some but much less than 0.5 mils of sliding, scratching, or rubbing of the probe needle tip on the bonding pad.

Some integrated circuits operate from a single very low power supply voltage, sometimes as low as 3 volts or even 2.5 volts. Consequently, small amounts of variation in the ground voltage provided by the probe test system can significantly and deleteriously influence probe test results. Such "ground bounce" noise can be reduced by connecting "ground bounce" capacitors to the ground conductors as close as possible to the ground probe needle. In prior art epoxy ring probe assemblies the ground supply conductor connected to the probe needle supplying a ground voltage to the DUT has been connected to a ground plane conductor on the printed circuit board of the assembly, and the power supply conductor connected to the probe needle supplying a power supply voltage to the DUT has been connected to a bypass capacitor connected to the ground plane on the printed circuit board. The substantial length of these two conductors has resulted in undesirable levels of ground noise and power supply noise being applied to the DUT during testing.

Most prior art wafer probe assemblies support the probe needles on an epoxy ring which is supported by a large printed circuit board. Such epoxy (or plastic) structures have large coefficients of thermal expansion and cause "errors" in the positions of probe needles as the ambient temperature varies. It would be desirable to eliminate this source of probe needle position error.

It would be desirable to provide a structurally simple probe assembly which avoids the need for "scrubbing" the tips of the probe needles against the bonding pads of the DUT to displace insulative aluminum oxide thereon, but nevertheless provide low probe contact resistance of the needle tips on the bonding pad. It also would be highly desirable to provide a probe assembly which is suitable for use in multi-DUT testing. It would be desirable to provide an improved semiconductor wafer probe apparatus and technique which economically provides low probe needle contact resistance, allows high frequency operation, and provides reduction of "ground bounce" and power supply noise.

SUMMARY OF THE INVENTION

Accordingly, it is an object of the invention to provide an economical wafer probing assembly that can accomplish high frequency testing with minimal probe contact resistance without extensive "scrubbing" of aluminum bonding pads by the contact tips of probe needles.

It is another object of the invention to provide such a wafer probing assembly which can be readily extended to use in multi-DUT testing of wafers containing die with bonding pad locations identified above as type I, type II and/or type III.

It is another object of the invention to provide such a wafer probing assembly which can be readily extended to use in multi-DUT testing of wafers containing die with bonding/probe pads located in an array in an integrated circuit.

It is another object of the invention to provide a wafer probing system which can accomplish high frequency testing with minimal probe contact resistance and which reduces the number of probe needle touch downs required to probe test each semiconductor wafer and thereby increase the life of probe needle assemblies.

It is another object of the invention to provide a wafer probe assembly which increases probe needle contact tip life.

It is another object of the invention to provide an economical wafer probe assembly which accomplishes high frequency testing with minimal probe contact resistance without excessive scrubbing of contact pads by contact tips of the probe needles and which provides relatively balanced probe contact forces on contact pads of the wafer relatively independently of ambient temperature.

It is another object of the invention to provide an economical wafer probe assembly and method that avoids the need to provide excessive overtravel of the probe needles or to carefully control the amount of probe needle overtravel needed to achieve effective scrubbing of the contact pads by the needle tips.

It is another object of the invention to provide a wafer probe assembly and method of the types described which reduces ground bounce noise voltages and/or power supply noise voltages.

It is another object of the invention to provide a wafer probing assembly with improved planarity of probe needle contact tips and reduced or limited "scrub distance" with minimum "over-travel".

It is another object of the invention to provide a wafer probe assembly with more precisely fixed, aligned, and planar probe needle contact tip positions than has been achieved in the prior art.

Briefly described, and in accordance with one embodiment thereof, the invention provides an apparatus for testing an integrated circuit on a semiconductor wafer so as to achieve low probe needle contact resistance with low probe needle force and without substantial scrubbing, including a probe assembly supporting a plurality of probe needles electrically coupled to an electrical test system above and having contact tips in alignment with a plurality of contact pads of the integrated circuit, respectively, each needle having a curved portion, a mechanical translating device operative to mechanically displace the wafer relative to the probe needles to bring a tip of each probe needle into physical contact with a corresponding contact pad, and to further mechanically displace the wafer against the probe needles to increase the needle force of each tip against the corresponding contact pad and thereby cause flexing of a curved portion of each probe needle. In two described embodiments, the curved portion of each needle has a curvature such that the flexing causes the tip of each probe needle to rock on the insulative oxide coating on the contact pad without sliding through a substantial distance on the surface of the corresponding pad. The rocking and the needle force causes lateral displacement of oxide from between the contact tip of the probe needle and metal of the contact pad to provide reliable, low resistance electrical contact between the contact tip and the corresponding contact pad.

BRIEF DESCRIPTION OF THE DRAWINGS

FIG. 1B is a top plan view diagram of a portion of a wafer probe assembly including two of the probe contact array assemblies of FIG. 1A arranged to accomplish multi-DUT testing.

FIG. 1C is a section view along section line 1C—1C of FIG. 1B.

FIG. 4 is a top plan view diagram of a probe assembly including a printed circuit board supporting two probe contact array assemblies of FIG. 2B and a support plate for the printed circuit board.

FIG. 4A is a section view along section line 4A—4A of FIG. 4.

FIG. 4B is a section view along section 4B—4B of FIG. 4.

DETAILED DESCRIPTION OF THE PREFERRED EMBODIMENTS

By way of definition, the term "scrubbing" as used herein is intended to refer to a substantial lateral scraping, scratching, or rubbing movement through a distance of roughly 0.5–1.5 mils by the contact tip of a probe needle against the surface of a bonding pad or other contact pad of an integrated circuit die, to penetrate through the brittle insulative oxide on the pad metal to achieve reliable electrical contact between the probe needle contact tip and the pad metal, with low needle force against the probe. The term "scrubbing" as used herein is in contrast to and exclusive of "micro-scrubbing" or "rocking" movements of the contacting tip of the probe needle on the integrated circuit bonding pads wherein there is much less than 0.5 to 1.5 mils of lateral movement of the contacting tip of the probe needle against the surface of the bonding pad.

In the described embodiments of the invention, a "test head" carries an "interface assembly" which in turn carries a probe assembly. Each probe assembly carries enough probe needles to effectuate testing of one or more integrated circuit die. The term "probe assembly" as used hereinafter is intended to include the combination of (1) a printed circuit board (PCB),
(2) at least one probe contact array assembly including (i) one or more "probe contact arrays" of probe needles to effectuate complete testing of one or more integrated circuit die (DUT), and (ii) a "flex circuit" or "tail" interconnection for electrically coupling each probe needle of the contact array(s) to a corresponding conductor of the printed circuit board, and
(3) a mechanical mounting assembly or bridge for mounting the probe contact array assembly to the probe card assembly and adjusting probe needle position.

The mechanical mounting assembly is capable of performing both a positioning function and an attachment function, so as to achieve alignment of the needle of the probe contact array with a corresponding DUT and also achieve the compliance of the probe needle contact tips necessary to account for variations in the planarity of the semiconductor wafer so that each probe needle contact tip makes electrical contact with a force in the range of roughly 1–12 grams against the intended bonding pads of the DUT or multiple DUTs.

A typical "interface assembly" includes a number of gold plated spring loaded telescoping "POGO pins". When the interface assembly is "brought down" on a probe card assembly, the spring loaded POGO pins collapse a bit and make the needed contact between contact pads of the printed circuit board and the test head, which is connected to the test system.

Figure 1A:
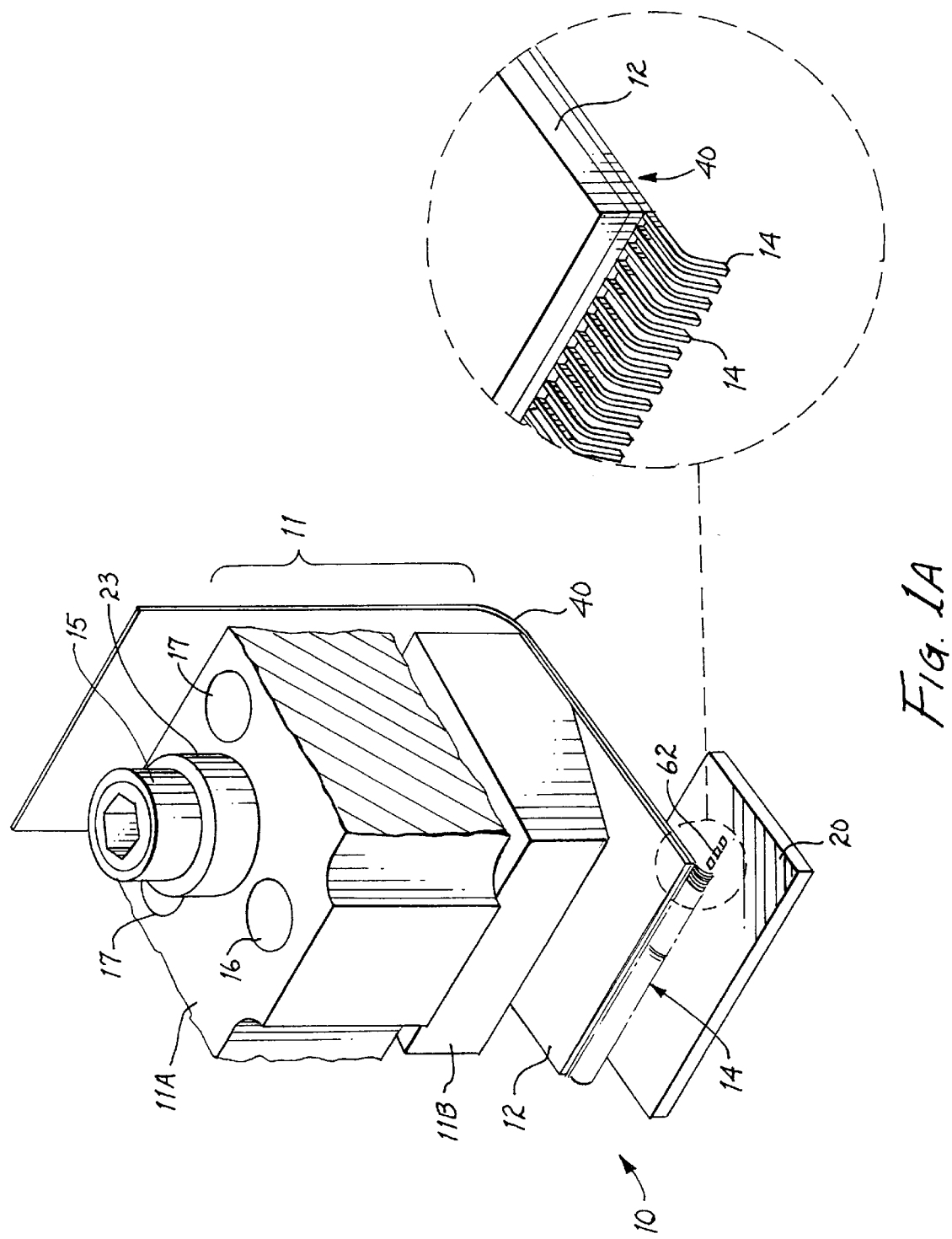
FIG. 1A is a perspective view of a probe contact array assembly according to a first embodiment of the present invention.

A first embodiment of the invention is shown in FIGS. 1A–1C and includes a "probe contact array assembly" 10 including a plated probe contact array 40 and a mounting assembly 11. Plated probe contact array 40 has the structure described above with reference to FIG. 2D, and includes an array of plated nickel alloy probe needles 14 extending therefrom. The probe contact array 40 is attached to the lower surface of a cantilever-mounted leaf spring 12, which is rigidly affixed at one end to a bottom surface of mounting assembly 11.

In FIGS. 1A–1C each of the individual probe needles 14 has a bent outer contact tip 14C which, during testing of the wafer, electrically contacts a corresponding bonding or contact pad 62 of an integrated circuit die 21 of a semiconductor wafer that also includes hundreds of other such integrated circuit die. The contact tips of the probe needles 14 are tapered from 2 to 4 mil width "shanks" on the probe contact array down to 0.5 to 2 mil width contact tips for contacting the bonding or contact pads or the solder bumps of the DUT.

By keeping the length of the portion of the probe needle extending beyond the ground plane less than roughly 50 to 150 mils (typically about 100 mils), very high frequency test probe signals can be reliably transmitted between the DUT and the wafer probe functional test system.

Mounting assembly 11 includes a lower base section 11B to which one end of leaf spring 12 is rigidly attached. The precise position of lower base section 11B relative to upper section 11A of mounting assembly 11 is determined by a set screw 16 extending through a threaded hole in upper section 11A to abut a horizontal upper surface of base section 11B. Set screws 17 perform the same function. A shoulder bolt 15 extends through a clearance hole in the upper surface of upper section 11A and is threaded into a hole in lower section 11B. A compression spring 23 is disposed about the shaft of bolt 15 between the shoulder thereof and the upper surface of upper section 11A to maintain a suitable bias force downward on lower section 11A.

As shown in FIG. 1B, one or more probe contact array assemblies 10 can be attached to a printed circuit board by means of a continuous "bridge" 11C that constitutes an extension of the upper section 11A of FIG. 1A to incorporate multiple identical side-by-side upper sections. Thus, bridge 11C includes multiple sets of access holes by means of which set screws 16 and 17 can be adjusted to adjust the planarity of the various sets of probe needles 14 against the contact columns (or rows) of corresponding bonding pads 62-1 (which columns are represented by lines 62-1 in FIG. 1B) of integrated circuit die 20 and 21, which are supported on a wafer chuck 54. Bridge 11C is rigidly attached to the metal plate 46 of the probe card assembly, as shown in FIGS. 4, 4A, and 4B. An identical adjacent probe contact array assembly also could be positioned to the right of the one shown in FIG. 1B to provide probe needles to contact column 62-2 of bonding pads of the same or a different die.

Referring to FIG. 1C, which is a section view along section lines 1C—1C of FIG. 1B, wafer chuck 54 moves upward in the direction of arrow 22 to thereby press the various contact pads of die 20 and 21 against corresponding contact tips of the probe needles 14.

Both leaf spring 12 and the portion of nickel alloy probe needles 14 extending beyond the ground plane (see numeral 27 in FIG. 2D) of probe contact array 40 are elastic to accommodate variations in the planarity of the semiconductor wafer containing integrated circuit die 20 and 21. The elasticity of leaf spring 12 in combination with the elasticity of the portions of probe needle 14 extending beyond the ground plane provides "compliance" which is helpful to uniformly provide needle forces of roughly 1–12 grams on each of the probe needles despite variations in flatness of the wafer.

According to several of the disclosed embodiments of the invention, flexing of the probe needle caused by the needle forces causes "tilting" or "rocking" of the contact tip of each probe needle 14 on the surface of an aluminum bonding pad. It has been found that the rocking of the contact needle tip on the brittle aluminum oxide effectively displaces the aluminum oxide from between the contact tip of each needle probe and the aluminum of the bonding pad, as later explained in detail with reference to FIG. 2G. (Such displacement of aluminum oxide by the rocking of the probe needle contact tip and the 1–12 gram needle force results in effective electrical contact of the probe needle contact tip to the contact pad, with low probe contact resistance.)

The embodiment of the invention shown in FIGS. 1A–C can provide probe tip contact either with or without "scrubbing" of the bonding pads by the probe needle contact tips. If the inclination angle of leaf spring 12 with respect to the surface of die 20 is small enough, and a suitable amount of compliance occurs in the probe needles during a "touch down", the contact tips of the probe needles will "rock" as described above as the wafer chuck moves through its 3 mil overtravel (subsequently defined with reference to FIG. 2G), to provide electrical contact between the contact tips and the bonding pads without substantial lateral scrubbing motion. However, if the inclination angle of leaf spring 12 is substantially greater, the contact tips of the probe needles will move laterally as the wafer chuck is raised through the above mentioned 3 mil overtravel distance and thereby scrub through the aluminum oxide layer to achieve electrical contact with the metal of the bonding pads.

Figure 2A:
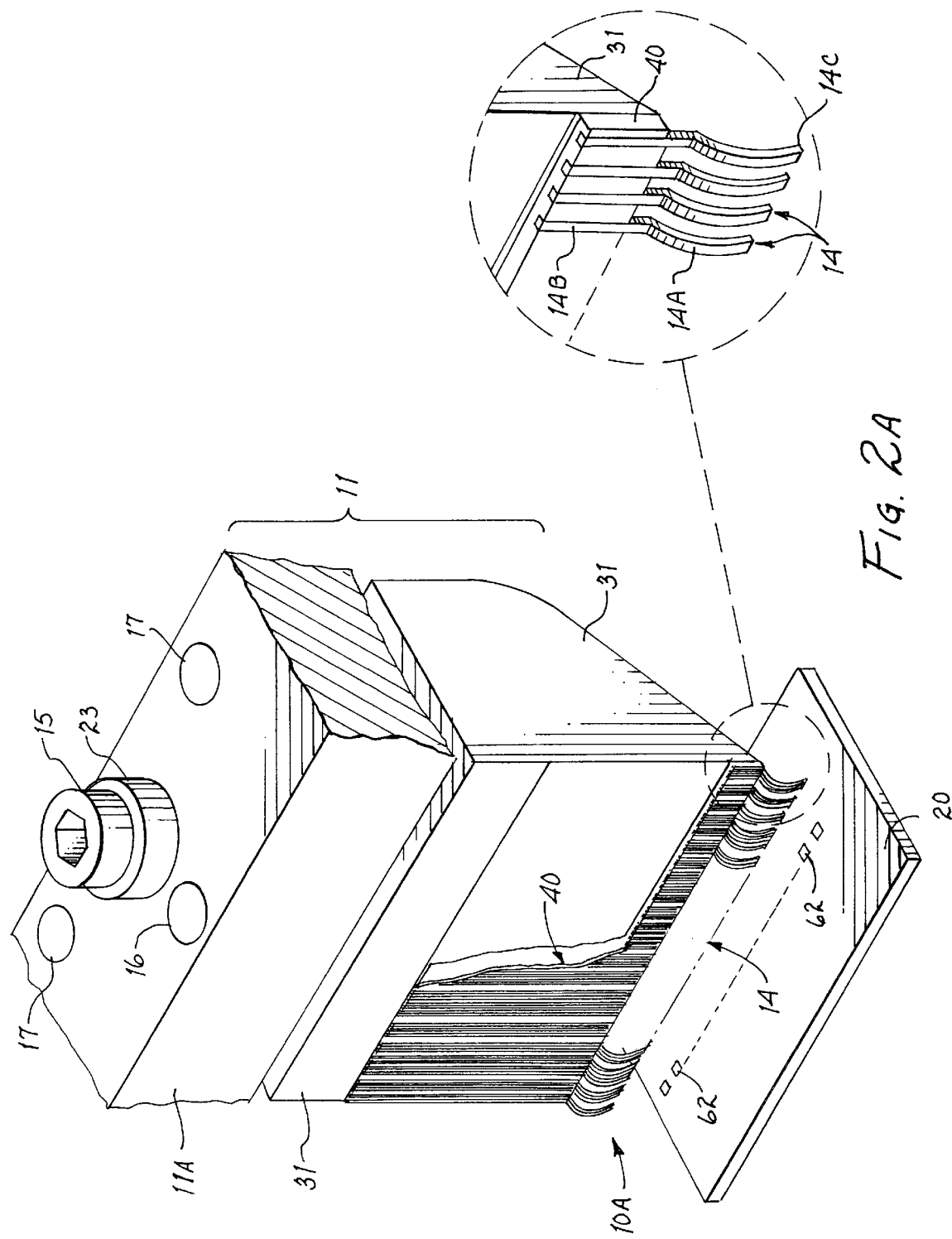
FIG. 2A is a perspective view of a portion of a probe contact array assembly of a second embodiment of the invention.
Figure 2B:
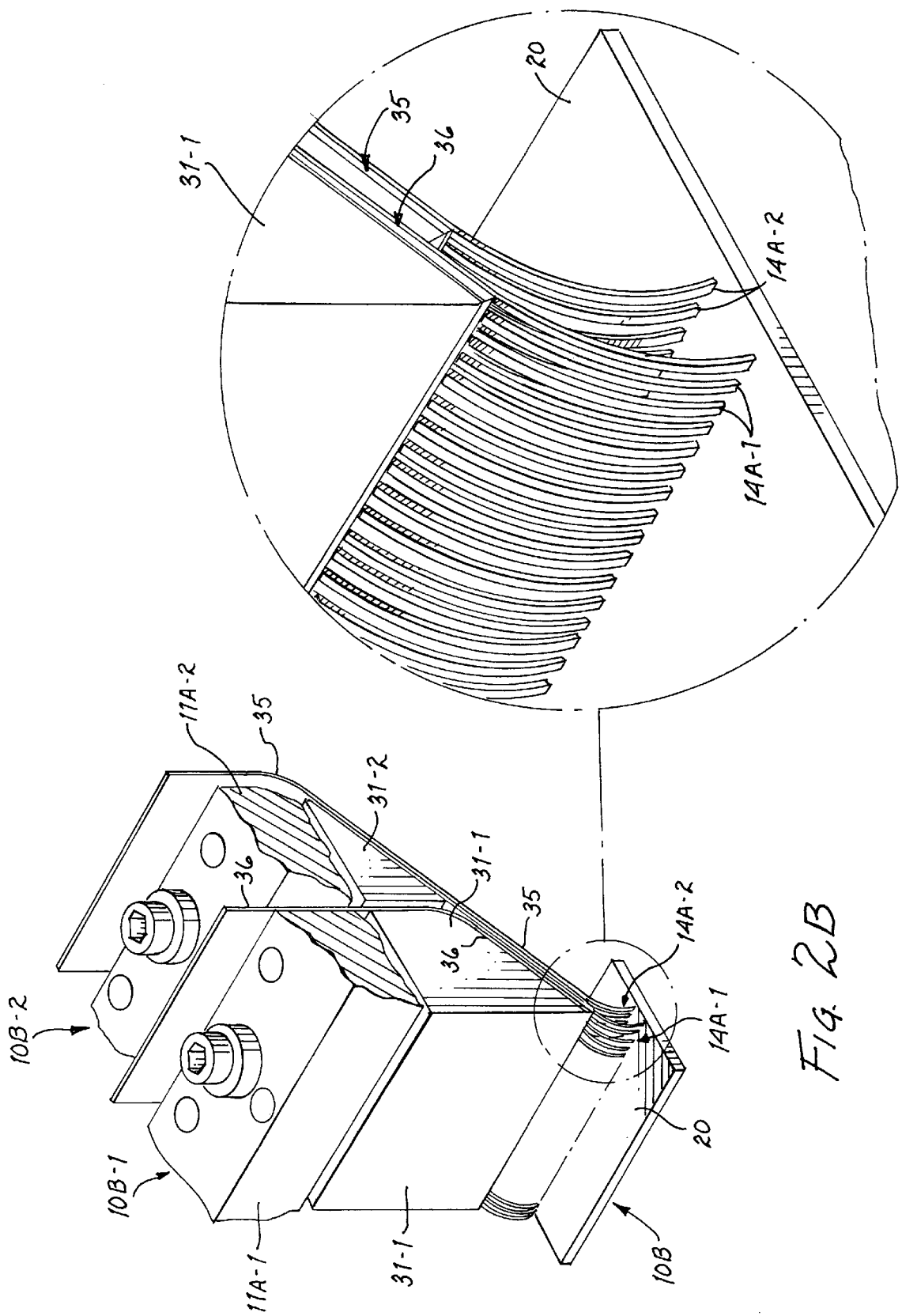
FIG. 2B is a perspective view of a variation of the second embodiment of the structure shown in FIG. 2A, supporting two "probe contact arrays" and probe needles thereof.
Figure 2C:
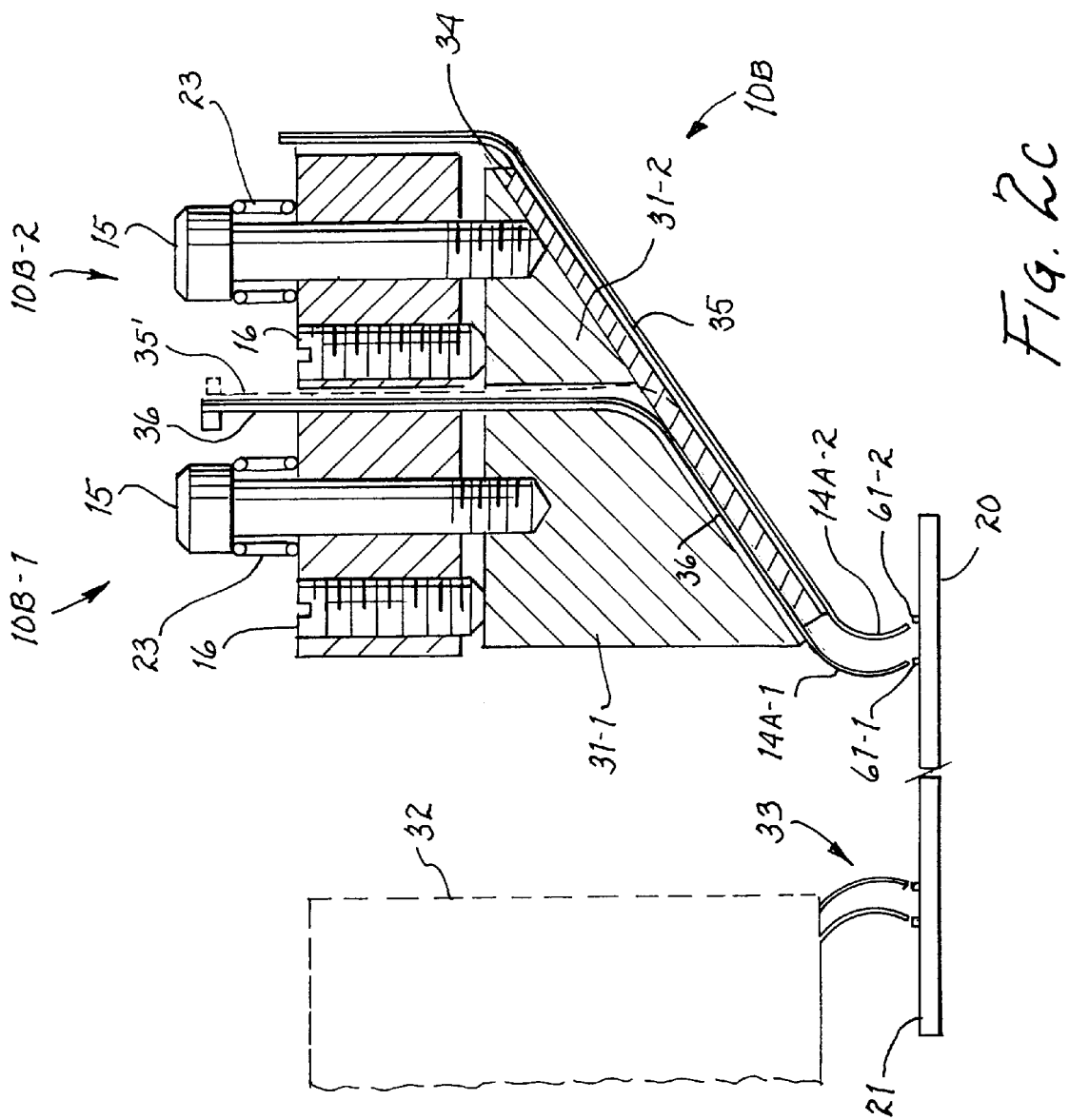
FIG. 2C is a partial side section view illustrating the use of two of the embodiments of FIG. 2B to probe adjacent die on a semiconductor wafer.

FIGS. 2A–2C illustrate two versions of a second preferred embodiment of the invention. Referring to FIG. 2A, a probe contact array assembly 10A includes mounting assembly 11 (similar to above-described mounting assembly 11 of FIGS. 1A–1C) supporting a probe contact array 40 including a row of nickel alloy probe needles 14. Probe needles 14 of FIGS. 2A–2C are of notably different design than the probe needles in the embodiment of FIGS. 1A–1C. The lower flex portion of each of probe needles 14 of FIG. 2A is generally "C-shaped", and the upper or shank portion of each needle 14 is straight. The needed compliance is achieved by flexing of only the C-shaped portions of probe needles 14. Typically, the probe needles of FIGS. 2A–2C are formed by plating, and initially they are straight. Then they are bent by a suitable bending fixture to provide the "out-of-plane" C shape portions 14A referred to above.

Figure 2D:
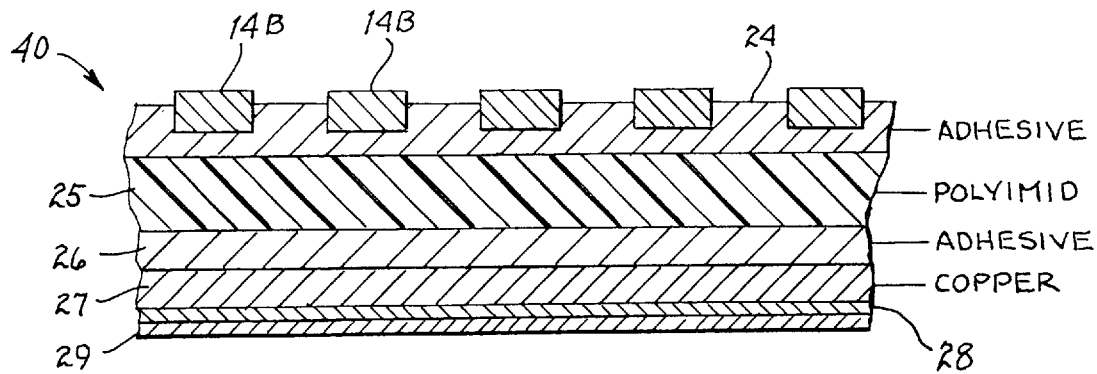
FIG. 2D is a section view of a "probe contact array" used in the wafer probe apparatus of the invention.

A cross sectional view of one embodiment of "probe contact array" 40 now will be described in detail with reference to FIG. 2D, wherein the shank portions 14B of each probe needle 14 are embedded as shown in an adhesive layer 24 on the upper surface of a polyimide insulator layer 25. The thickness of probe needle shanks 14B is approximately 2 mils, and the thickness of the adhesive layer 24 is roughly 3 mils. The polyimide layer 25 is approximately 2 mils thick. A copper ground plane 27 is attached by adhesive 26 to the bottom surface of polyimide insulator 25. A very thin (approximately 100 micro inches) nickel barrier layer 8 is plated on the bottom side of copper ground plane 27, and an approximately 10 micro inch gold layer 29 is plated on the bottom surface of nickel barrier layer 28.

The probe contact array 40 is clamped to or adhesively attached to the front face of lower section 31 of mounting assembly 10A as shown in FIG. 2A. The upper end of probe contact array 40 extends upward beyond the upper surface of upper section 11A.

Upper section 11A of mounting assembly 11 is similar to upper section 11A of mounting assembly 11 in FIG. 1A, to allow adjustment of the planarity of the probe needles 14 before their contact tips touch the corresponding contact pads 62 of die 20. Similarly to FIG. 1B, mounting assembly 11 of FIG. 2A can be extended to incorporate additional side-by-side mounts for separate contact arrays of probe needles 14. More than one of the embodiments shown in FIG. 2A can be attached by a bridge 11A as in FIG. 1B to a plate 46 as in FIG. 4 supplying a printed circuit board of the probe card assembly.

FIG. 2B shows a variation 10B of the probe contact array assembly 10A shown in FIG. 2A. Referring to FIGS. 2B and 2C, assembly 10B includes two probe contact array assemblies 10B-1 and 10B-2 that are similar to the probe contact array assembly 10A in FIG. 2A, except that the base element 31-1 in FIGS. 2B and 2C is taller than base element 31-2, and base elements 31-1 and 31-2 and both have sloped bottom surfaces supporting two separate probe contact arrays 35 and 36, respectively. As shown in FIG. 2C, probe contact arrays 35 and 36 are adhesively affixed to opposite faces of an insulative layer 34, which can be composed of polyimide. The lower surface of upper probe contact array 36 is adhesively attached to the upper surface of the lower left portion of insulative layer 34, and extends upwardly along the right side of assembly 10B-1. The upper surface of upper probe contact array 36 is attached to the lower surface of base element 31-1. Probe contact array 35 is adhesively attached to the bottom surface of insulative layer 34 and either extends upward along the right side of probe contact array assembly 10B-2 or upward as indicated by dotted line 35' along the right side of probe contact array assembly 10B-1, in which case probe contact array assembly 10B-2 is omitted.

A row of C-shaped flex portions 14A-1 of nickel alloy probe needles extend downward from the lower edge of probe contact array 36. Similarly, at the lower edge of probe contact array 35 a second row of generally C-shaped nickel alloy probe needle flex sections 14A-2 extends downward. The contact tips of probe needles 14B lie in the same horizontal "contact" plane as the contact tips of probe needles 14A. The two rows of C-shaped probe needle flex portions 14A-1 and 14B-2 are precisely aligned to contact two rows (or columns) of bonding pads 62-1 and 62-2, respectively, on integrated circuit die 20 of a semiconductor wafer. As shown in FIG. 2C, bonding pads of an adjacent die 21 can be contacted by identical but mirror imaged probe contact array assembly 32 with base elements 31-1, 31-2, and 32 being attached to a printed circuit board to accomplish multi-DUT testing of the wafer including die 20 and die 21. The needle force applied to the bonding pads by the contact ends of C-shaped probe needle flex portions 14A and 14B can be adjusted by means of set screws 16 and 17 of probe contact array assemblies 10B-1 and 10B-2.

"Scrubbing" (as defined above) of the needle contact tips on the bonding pads is essentially eliminated; nevertheless low contact resistance is achieved with low needle force (roughly 1–12 grams per needle) on the bonding pads because the "rocking" of the needle contact tips effectively displaces aluminum oxide between the probe needle tips and the aluminum metal of the bonding pads, and thereby provides metal-to-metal contact between the needle contact tips and the bonding pads.

Figure 2E:
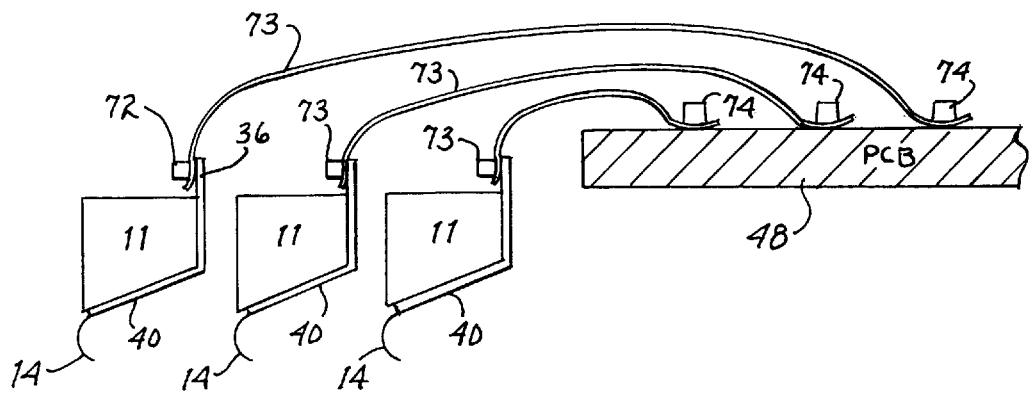
FIG. 2E is a section view diagram illustrating connection of probe contact arrays to conductors of a printed circuit board in a probe test head by means of flex circuits.

FIG. 2E illustrates how several probe contact array assemblies are electrically connected to conductive traces on a printed circuit board 48 (which is supported on a metal plate such as 46 in FIG. 4, to which a bridge 11C constituting the upper portion of mounting assemblies 11 is rigidly attached. Mounting assemblies 11 support probe contact arrays 40, the upper ends of which extend above the upper surfaces of mounting assemblies 11. The upper end portion of each probe contact array 40 is attached by a clamp 72 to a flex circuit 73. Each clamp 72 holds plated conductor contact areas of the probe contact array 40 against corresponding plated conductor contact areas of a flex circuit 73, so that each of probe needles 14 is connected to a corresponding conductor of flex circuit 73. At the opposite end of each flex circuit 73, contact areas of each flex circuit conductor are held by a clamp 74 against corresponding conductors on printed circuit board 48. Since the insulator of probe contact array 40 has a back plane conductor, as does flex circuit 73, the entire signal path through flex circuit 73 and probe contact array 40 constitutes a 50 ohm transmission line, except for the roughly 100 mil portion of probe needles 14 extending beyond the edge of the ground plane. Therefore, signal reflections are avoided and very high probe signal frequencies can be achieved.

Figure 2F:
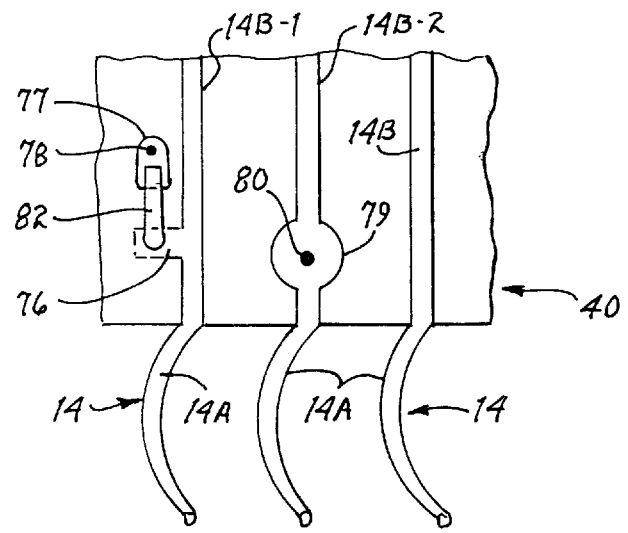
FIG. 2F is a partial plan view of a probe contact array illustrating a via connecting a ground conductor to a ground plane, and also illustrating a power supply bypass capacitor connected adjacent to the edge of a ground plane of the probe contact array.

FIG. 2F shows how a probe needle having a shank portion 14B-2 and carrying a ground supply voltage has an enlarged portion 79. A conductive via or feedthrough 80 extends through a hole in enlarged portion 79 and electrically contacts ground plane conductor 27 of FIG. 2D. This connection is very effective in eliminating the ground "bounce" or ground noise voltages referred to above. Also, FIG. 2F shows the shank portion 14B-1 of a probe needle that conducts a power supply voltage and includes an extending tab portion 76. A ground plane conductor 27 on the upper surface of probe contact array 40 is connected to ground plane conductor 27 by a conductive feedthrough 78. A bypass capacitor chip 82 has its opposite terminals connected to ground plane conductor 27 and power supply probe needle 76, respectively. This configuration helps reduce both power supply noise and ground noise very close to the probe needle contact tips which apply a ground voltage and a power supply voltage to the DUT under test. The low ground noise and low power supply noise is especially advantageous in testing of low voltage integrated circuits.

Figure 2G:
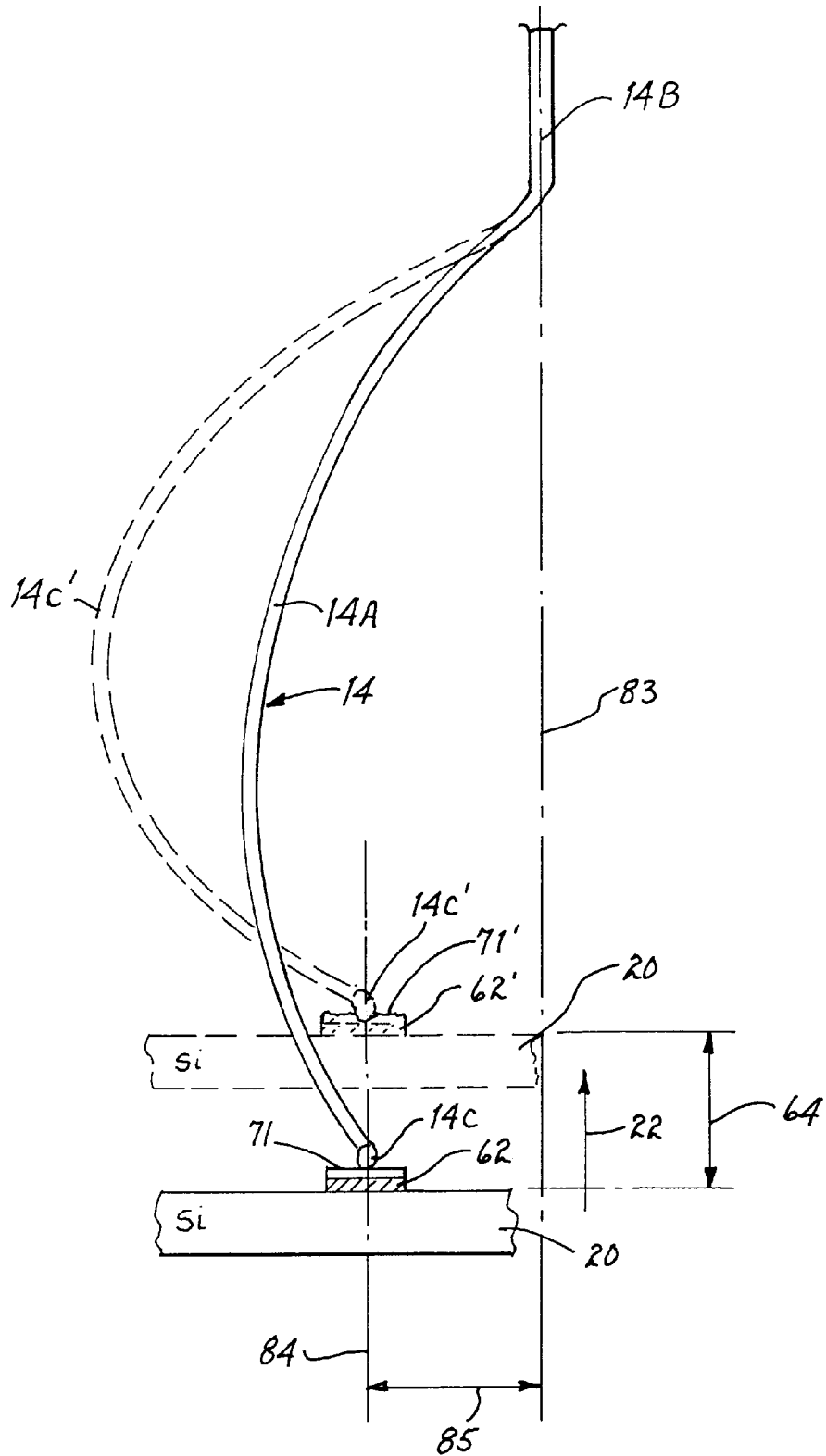
FIG. 2G is a partial side elevation view illustrating probe needle contact tip rotation displacing aluminum oxide due to flexing of the probe needle during a "touch down" onto an aluminum bonding pad of an integrated circuit under test.

FIG. 2G illustrates how the flex portion 14A of a C-shaped probe needle 14 results in the above mentioned rocking of the probe needle contact tip 14C on the oxide coating of a bonding pad during a "touch down", wherein a semiconductor wafer containing the die under test 20 is raised approximately 3 mils as indicated by arrow 22 to produce the flexed probe needle configuration 14C' indicated in dotted lines in FIG. 2G. Initially the aluminum bonding pad 62 on integrated circuit die 20 has a thin layer 71 of brittle insulative aluminum oxide thereon, preventing probe contact tip 14C from making reliable electrical contact to the metal of aluminum bonding pad 62 unless the needle force of needle tip 14C on oxide layer 71 exceeds roughly 20 grams.

However, with probe needle shank 14B stationary, raising of the wafer chuck and die 20 through an "overtravel" distance 64 of approximately 3 mils in the direction of arrow 22 produces the illustrated substantial flexing of the C-shaped portion of probe needle 14, as indicated by 14C' in FIG. 2G. This causes the rocking or rotating of probe contact tip 14C, as indicated by 14C' in FIG. 2G, producing a "micro-scrubbing" of the aluminum oxide 71 out from between probe tip 14C' and the metal 61' of aluminum bonding pad 62; the displaced aluminum oxide is indicated by numeral 71' in FIG. 2G. This is achieved with a needle force of only approximately 1–12 grams pressing contact tip 14C against bonding pad 62 in the flex configuration indicated by the dotted lines in FIG. 2G.

Figure 8:
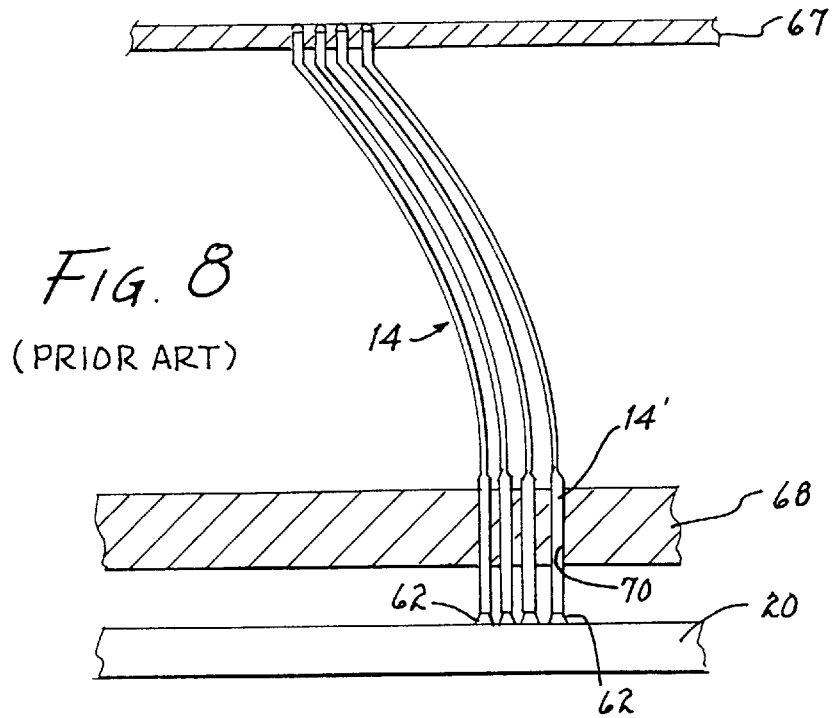
FIG. 8 is a partial section view diagram useful in describing the prior art.

In FIG. 2G dashed line 84 passes through the tip 14C of the unflexed probe needle portion 14A. Dashed line 83 is parallel to the longitudinal axis of probe needle shank 14B. Distance 85 indicates an initial offset of "unflexed" contact tip 14C from axis 83. We have discovered that this offset distance 85 is necessary to prevent lateral force of contact tip 14C on bonding pad 62 as die 20 and probe needle portion 14A are moved upward as indicated by arrow 22 to provide the flexed configuration indicated by numeral 14C'. Thus, scrubbing of contact tip 14C against bonding pad 62 is avoided without use of an expensive, space-consuming lower guide template such as 68 in prior art FIG. 8.

However, if it were desired to provide a predetermined amount of lateral force of contact tip 14C on bonding pad 62 as it is displaced from its initial position in FIG. 2G to the position indicated by numeral 62' so as to accomplish a desired amount of scrubbing, the offset distance 85 could be changed to accomplish that purpose.

Figure 3:
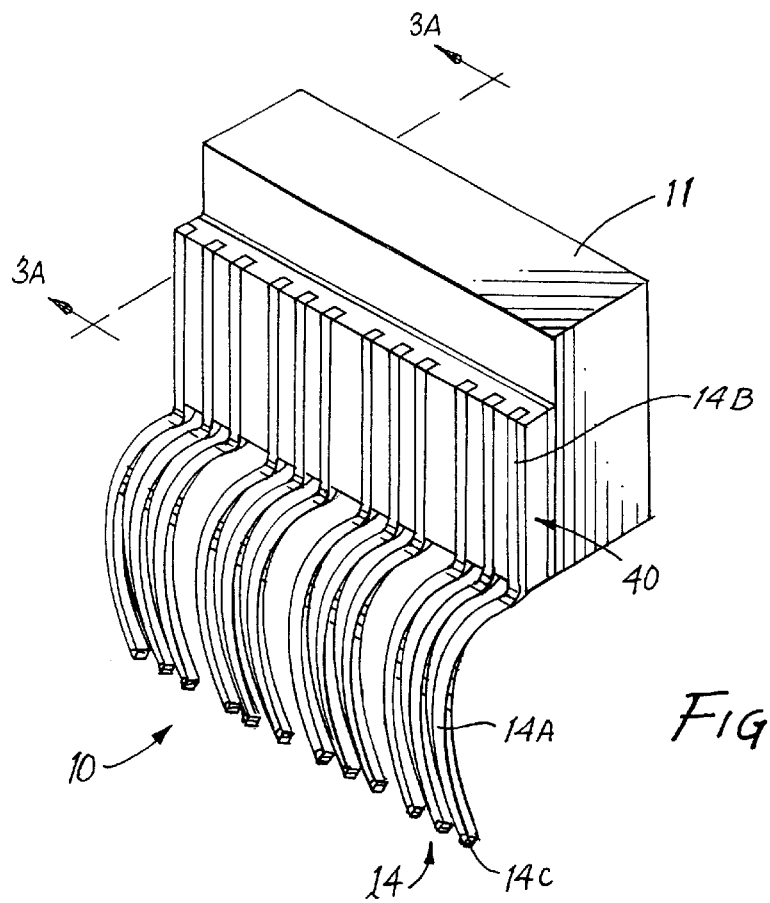
FIG. 3 is a perspective diagram of a portion of a probe assembly of a third embodiment of the invention.

FIG. 3 shows a third embodiment of the invention, in which a plurality of probe needles 14, each having a generally C-shaped lower flex portion 14A extending downward from the edge of the ground plane 27 (FIG. 2D) of the probe contact array 40 and a probe needle contact tip 14C. Each probe needle 14 also has a straight vertical upper shank portion 14B. In the embodiment of FIG. 3 the front surfaces of both the upper portions 14B and the C-shaped lower portions 14A are "in-plane", i.e., they lie in a common plane. The probe contact array 40 is clamped or adhesively attached to a mounting assembly 11 as shown, except that the probe contact array 40 actually extends above the upper surface of mounting assembly 11 as shown in FIG. 2E to allow connection to a flex circuit 73 (see FIG. 2E).

Figure 3A:
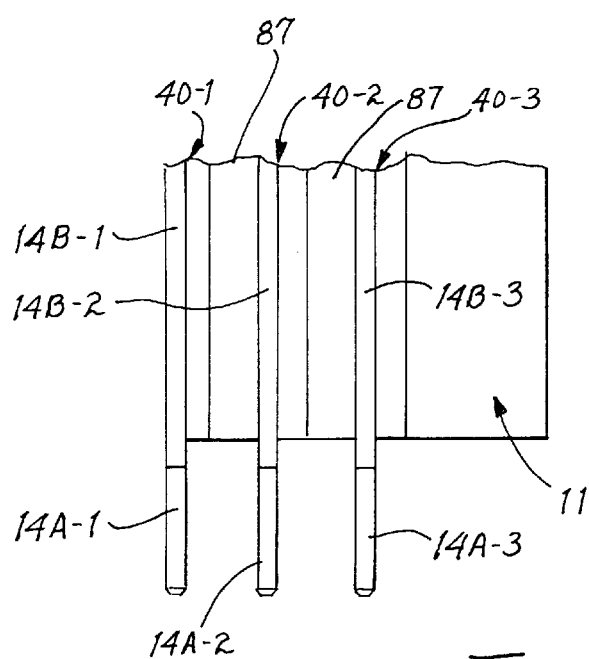
FIG. 3A is a modified section view across section line 3A—3A of FIG. 3 showing use of "layered" probe contact arrays to accomplish testing of integrated circuit arrays.

FIG. 3A shows a section view of a variation of the embodiment of FIG. 3, wherein multiple probe contact arrays 40 with "in-plane" probe needle flex portions 14A are "stacked" in parallel, each attached to and separated from the others by an insulative layer 87 to provide probe tip contact with an array of contact pads in an integrated circuit such as a programmable logic array (PLA).

Figure 3B:
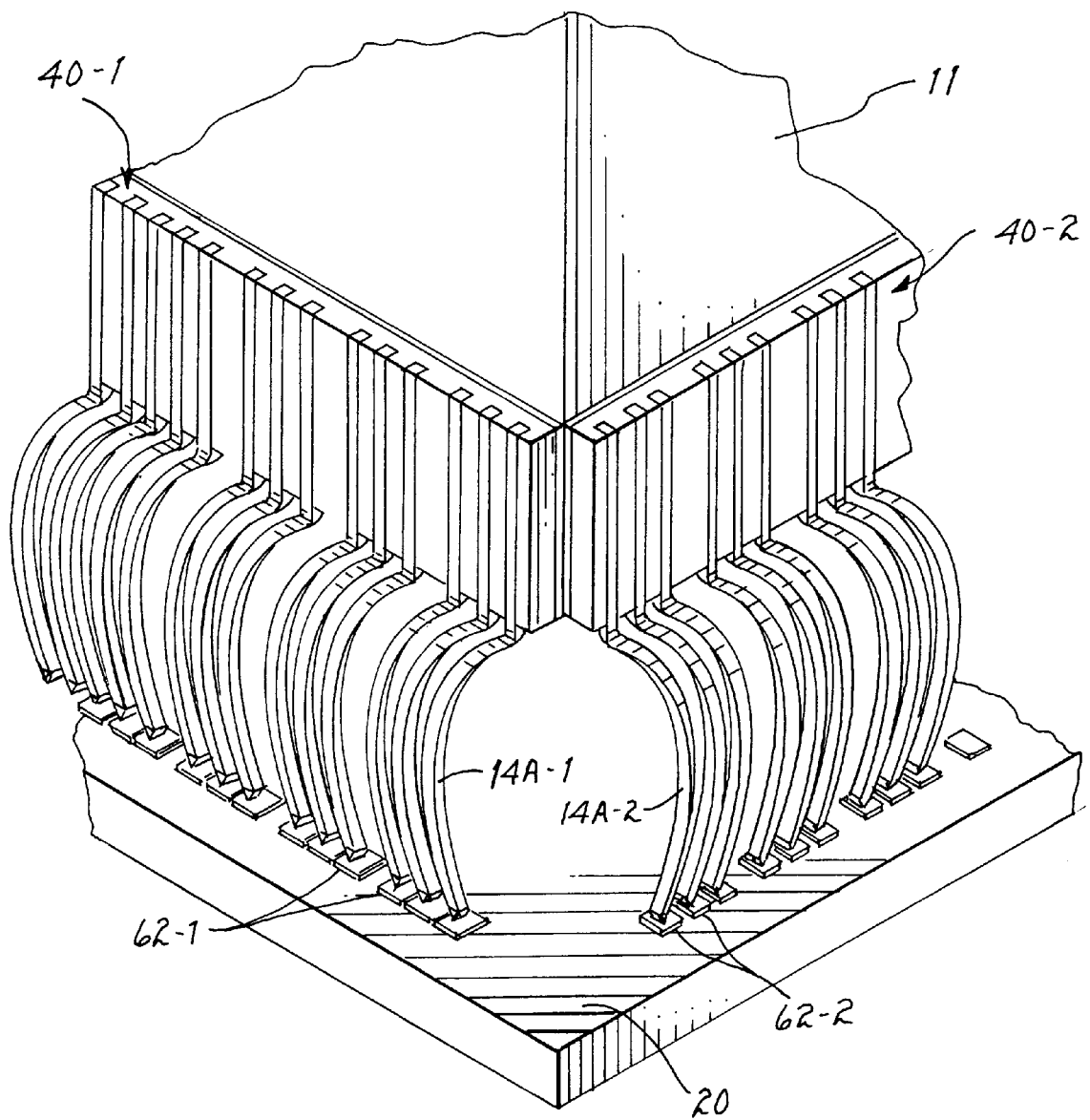
FIG. 3B is a partial perspective diagram useful in explaining how the apparatus of FIG. 3 can be extended to multi-DUT testing of die having "type III" bonding pad locations.

FIG. 3B shows how multiple "plated in-line" probe contact arrays 40 of the type shown in FIG. 3, including 40-1 and 40-2 in FIG. 3B, can be mounted on the four sides of a suitable mounting assembly 11 to probe test a "type III" integrated circuit die 20 with bonding pads located along all four edges. This structure could be repeated on a single bridge such as 11C of FIG. 4 to accomplish simultaneous multi-DUT testing of type III die. Although FIG. 3B shows the probe needle flex portions 14A-2 curved in the opposite direction to probe needle flex portions 14A-1, preferably all of the probe needle flex sections are curved in the same direction (i.e., all are either "C-shaped" or "reverse-C-shaped") to avoid interference at one corner of the mounting assembly 11.

FIGS. 4, 4A, and 4B disclose top and sectional views of a circular steel metal support plate 46 including a flat bottom 46B having a rectangular opening 53 therein. Support plate 46 has a cylindrical side 46A having an annular shoulder 46C used to support plate 46 in a mating collar of a "prober" machine (not shown), which can be any of a number of commercially available machines, for example, a model 4080 from Electroglass Inc. The prober includes the wafer chuck 54 (see FIG. 1C) and also provides precise horizontal xy motion control thereof. Probe contact array assemblies 10B-1 and 10B-2 are part of a bridge such as 11C (see FIG. 1B) that is bolted onto support plate 46. Circular printed circuit board 48 rests on and is attached by screws to the upper surface of bottom 46B of plate 46. Bridge 11C extends over rectangular opening 53 of plate 46, and the probe contact array assemblies 10B-1 and 10B-2 extend downward through opening 53 in bottom plate 46B to the wafer including die 20 and 21 supported on a conventional wafer chuck (not shown). A conventional interface assembly (not shown) containing spring loaded "POGO pins" is precisely positioned above printed circuit board 48. The POGO pins are located in predetermined guide holes in an insulative template to provide electrical contact to conductors which fan out from a cable (not shown) connected to the test system 59 (See FIG. 5) to contact pads 49 and conductive traces on printed circuit board 48 which are connected to the flex circuit 73 (see FIG. 2E). The direct rigid connection of the probe contact array assemblies 10B and 32 to the plate 46 substantially eliminates the above mentioned thermal instability of probe needle contact tip positions.

Figure 5:
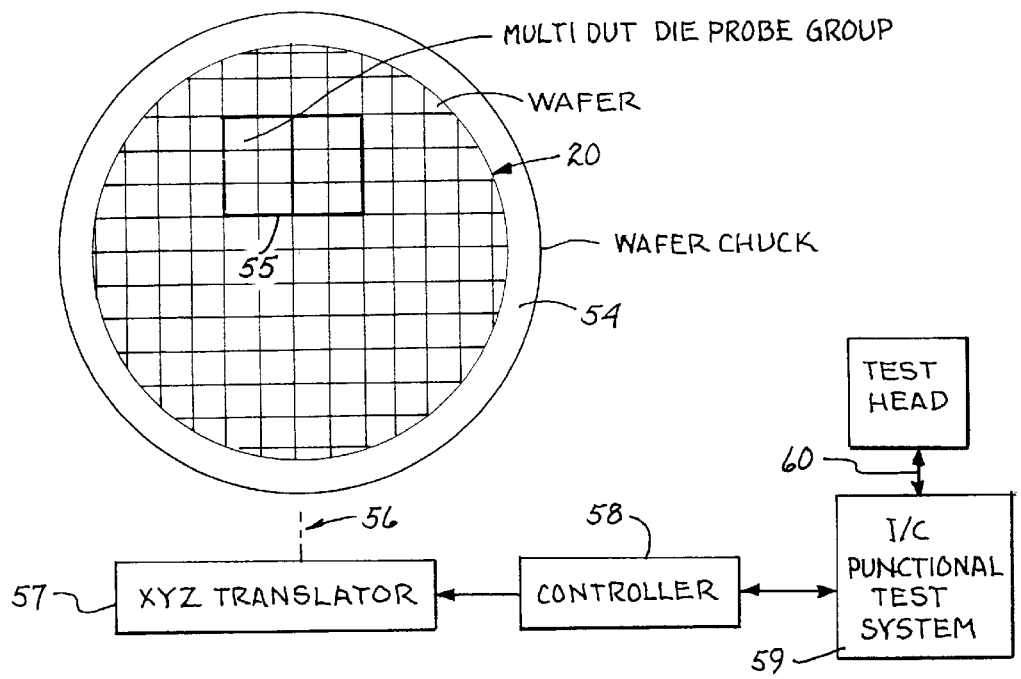
FIG. 5 is a plan view diagram of a semiconductor wafer mounted on a chuck, indicating a multi-DUT testing pattern, and also illustrating other components of a wafer probe test system.
Figure 6:
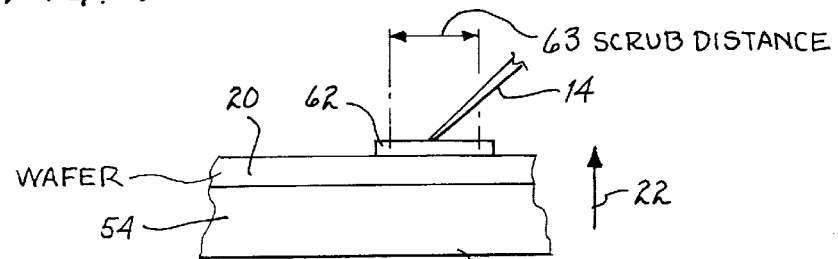
FIG. 6 is a partial section view diagram useful in describing the prior art.
Figure 7:
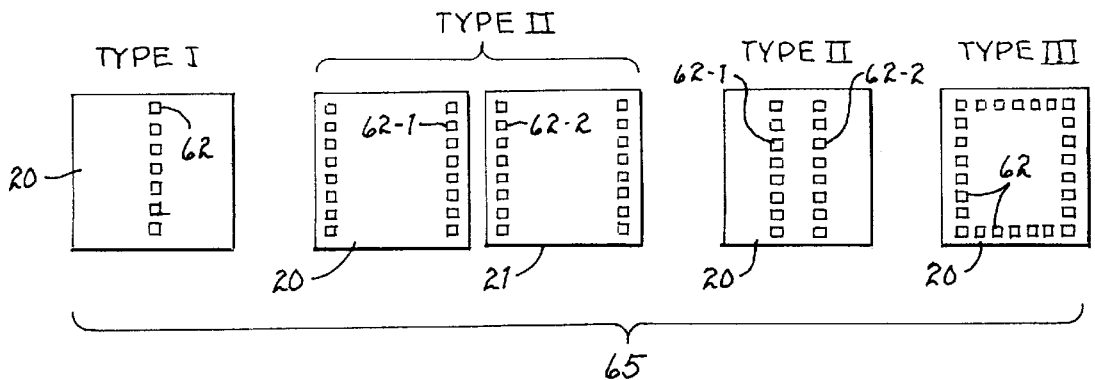
FIG. 7 is a diagram identifying different types of bonding pad arrangements on integrated circuits.

FIG. 5 schematically shows a number of basic components of a wafer probe test system, including a wafer chuck 54 that supports a semiconductor wafer 20 that typically includes hundreds of semiconductor die. A test head including the above mentioned interface assembly and probe card assembly is used. For single-DUT testing, wafer chuck 54 and wafer 20 are raised by an xyz translator 57 of the above mentioned prober to bring the bonding pads of the DUT into contact with the corresponding probe needle contact tips, applying needle forces in the range of about 1–12 grams to press each needle against a corresponding bonding pad aligned therewith. Movement of xyz translator 57 in the directions of the x, y, and z Cartesian coordinate axes is controlled by the prober to position wafer chuck 54 in alignment with selected die (or groups of die) on wafer 20. Integrated circuit test system 59 coordinates movement of xyz translator 57 with generation of power supply and test signals on multiconductor bus 60 connected to the above mentioned test head, interface adapter, and "probe card assembly" as defined above, and also receives response signals from the single DUT or multiple DUTs being probed.

Note that the multi-DUT probe pattern may be different for each wafer type to be probed. The multi-DUT probe pattern which will result in fewest touch downs to probe an entire wafer is generally rectangular, but the best configuration usually is determined in part by the height-to-width ratio of the DUT to be probed.

Thus, several embodiments of the invention provide a probe card assembly and technique which can be used for individual DUT or multi-DUT testing, characterized by rocking of the needle tips so as to displace aluminum oxide and achieve good electrical contact and low probe contact resistance without the scraping or scratching movement commonly known as scrubbing, with individually compliant nickel alloy probe needles, without provision of a lower "guide template" as in the prior art Cobra structures (FIG. 8) which provide guides for the probe needle tips. (Alternatively, the amount of offset distance 85 can be designed so as to provide a small desired amount of lateral force on the probe needle contact tips along the bonding pads to achieve a small desired amount of scrubbing.) The probe contact arrays of the present invention can be made by "batch processing" to provide very uniform probe needle properties and dimensions and planarity of contact tip locations. The described structures result in balanced contact force (BCF) of all of the probe needles and hence in uniform probe needle life. The ability to connect the probe needles supplying a ground voltage or power supply voltage to the DUT to a ground plane conductor or a bypass capacitor very close to the probe needle contact tips results in very low ground noise and power supply noise on the DUT. This avoids the need for adjustment of individual probe needles. The entire signal path between the printed circuit board POGO pin contact pads and the probe needle contact pads consists of 50 ohm transmission line, except for the 50 to 150 mils of probe needle extension beyond the ground planes of the probe contact arrays, eliminating signal reflections and allowing very high test signal frequencies or data rates. Thermal instability of probe needle positions is avoided by the use of plate 46 and direct attachment of bridge 11C thereto.

Figure 9:
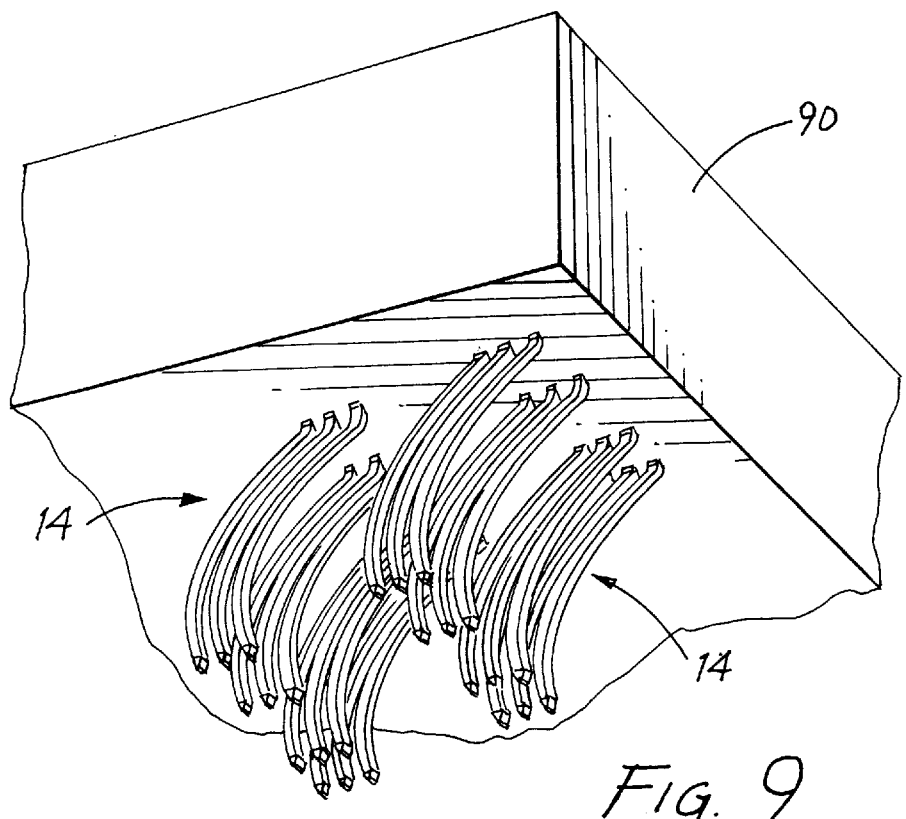
FIG. 9 is a partial perspective view of an alternative embodiment of the invention.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, the term "probe needle" is intended to encompass any short, conductive protrusion for electrically contacting the contact pads or conductors of an integrated circuit under test. Different probe contact array structures than the one shown in FIG. 2D can be provided. For example, the probe needle shanks of pre-formed probe needles 14 in FIG. 9 could be inserted into pre-drilled holes in an insulative ceramic layer of a multi-layer ceramic structure 90 and soldered to conductive traces (not shown) plated on a ceramic layer.

What is claimed is:

1. A method of testing an integrated circuit on a semiconductor wafer without scrubbing so as to nevertheless achieve low probe needle contact resistance with low probe needle force, the method comprising the steps of:

(a) supporting a plurality of probe needles electrically coupled to an electrical test system in alignment with a plurality of contact pads of the integrated circuit, respectively;

(b) mechanically displacing one of the wafer and the probe needles relative to the other to bring a contact tip of each probe needle into physical contact with a corresponding contact pad;

(c) further mechanically displacing one of the wafer and the probe needles to increase a needle force of each contact tip against the corresponding contact pad and cause flexing of a curved portion of each probe needle without scrubbing;

(d) the flexing causing the contact tip of each probe needle to rock on the surface of the contact pad without scrubbing; and (e) the rocking and the needle force together causing lateral displacing of oxide from between the contact tip and metal of the contact pad to provide reliable, low resistance electrical contact between the contact tip and the contact pad.

2. The method of claim 1 wherein step (c) includes increasing the needle force to a maximum level that is substantially less than 20 grams.

3. The method of claims 2 wherein the maximum needle force is in the range of approximately 1 to 12 grams.

4. The method of claim 1 wherein each of the probe needles includes a generally C-shaped flex portion and a straight shank portion, the contact tip of each needle being at an end of the C-shaped flex section, step (a) including supporting the shank portion on an opposite face of an insulative layer from a ground plane conductor, the C-shaped flex portion extending beyond an edge of the ground plane conductor.

5. The method of claim 4 wherein step (c) causes flexing of only the C-shaped flex portion of each probe needle.

6. The method of claim 5 wherein steps (b) and (c) include supporting the semiconductor wafer on a wafer chuck and mechanically displacing the wafer chuck.

7. The method of claim 4 wherein the C-shaped flex sections extend in the range of roughly 50 to 150 mils beyond the edge of the ground plane conductor, and steps (b) and (c) together displace the wafer relative to the contact tips of the probe needles through a distance of roughly 3 mils.

8. The method of claim 1 wherein the displacing of steps (b) and (c) is linear and perpendicular to the surface of the contact pad.

* * * * *